United States Patent
Ohtsu et al.

(10) Patent No.: US 9,308,676 B2
(45) Date of Patent: Apr. 12, 2016

(54) METHOD FOR PRODUCING MOLDS

(71) Applicant: FUJIFILM Corporation, Minato-Ku, Tokyo (JP)

(72) Inventors: Akihiko Ohtsu, Minamiashigara (JP); Akiko Hattori, Minamiashigara (JP); Katsuhiro Nishimaki, Minamiashigara (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 14/040,914

(22) Filed: Sep. 30, 2013

(65) Prior Publication Data

US 2014/0069889 A1 Mar. 13, 2014

Related U.S. Application Data

(63) Continuation of application No. PCT/JP2012/059619, filed on Apr. 2, 2012.

(30) Foreign Application Priority Data

Mar. 31, 2011 (JP) .................................. 2011-077512

(51) Int. Cl.
*B44C 1/22* (2006.01)
*B29C 33/38* (2006.01)
(Continued)

(52) U.S. Cl.
CPC ............. *B29C 33/3842* (2013.01); *B82Y 10/00* (2013.01); *B82Y 40/00* (2013.01); *G03F 7/0002* (2013.01)

(58) Field of Classification Search
CPC .................. H01L 21/31138; H01L 21/31127; H01L 21/31144; C03C 15/00; B29C 33/3842; B29C 33/56; B29C 33/58; B29C 33/3828; C23C 15/00

USPC .............. 216/40, 41, 43, 46, 67, 80; 438/706, 438/714, 725
See application file for complete search history.

(56) References Cited

U.S. PATENT DOCUMENTS 3,986,912 A * 10/1976 Alcorn et al. ................. 438/713
5,294,778 A    3/1994 Carman et al.
5,624,583 A *  4/1997 Tokashiki et al. ............. 438/720
(Continued)

FOREIGN PATENT DOCUMENTS

EP            2 149 817 A2    2/2010

OTHER PUBLICATIONS

Tokuhisa Ohiwa, et al., "SiO₂ Tapered Etching Employing Magnetron Discharge of Fluorocarbon Gas", Jpn. J. Appl. Phys., 1992, pp. 405-410, vol. 31, Part 1, No. 2A.
(Continued)

*Primary Examiner* — Lan Vinh
(74) *Attorney, Agent, or Firm* — Sughrue Mion, PLLC

(57) ABSTRACT

In production of a mold having a deposited film on the surface thereof as a mold release layer, a quartz substrate plasma etched employing an etching gas that includes a sedimentary gas to form a pattern of protrusions and recesses having a desired shape in a structure constituted by the quartz substrate and a mask layer, while a deposited film constituted by sediment of the sedimentary gas is formed along the pattern of protrusions and recesses. The deposited film becomes the mold release layer. Thereby, throughput of mold production is improved in the production of molds having deposited films as mold release layers on the surfaces thereof.

15 Claims, 4 Drawing Sheets

(51) Int. Cl.
  *B82Y 10/00*   (2011.01)
  *B82Y 40/00*   (2011.01)
  *G03F 7/00*   (2006.01)

(56) References Cited

U.S. PATENT DOCUMENTS

| | | | |
|---|---|---|---|
| 5,846,375 | A | 12/1998 | Gilchrist et al. |
| 8,088,691 | B2 * | 1/2012 | Kiehlbauch et al. .......... 438/723 |
| 2003/0162395 | A1 * | 8/2003 | Trapp ............................ 438/689 |
| 2008/0187719 | A1 * | 8/2008 | Uchida ......................... 428/156 |
| 2009/0163344 | A1 * | 6/2009 | Weber et al. ..................... 501/53 |
| 2010/0025366 | A1 * | 2/2010 | Furui ............................. 216/41 |
| 2010/0055346 | A1 | 3/2010 | Yen et al. |

OTHER PUBLICATIONS

D. Mezerette, et al., "Production and Control of High-Pressure Surface-Wave Plasmas for Water-Repellant Fluorocarbon Film Deposition", Thin Solid Films, 2005, pp. 178-182, vol. 475, Nos. 1-2.

V. V. Smirnov, et al., "Molecular-dynamics model of Energetic Fluorocarbon-ion Bombardment on $SiO_2$ II CF+x (x=1, 2, 3) Ion Etch Characterization", Journal of Applied Physics, 2005, pp. 093303-1-093303-10, vol. 97, No. 9.

M. Okada, et al., "Nanoimprinting Using Plasma Chemical Vapor Deposition Film Using Mixture Gas with $CHF_3$ and $O_2$ Gases Formed on Mold", Extended Abstract of the 56th JSAP Spring Meeting, 2009, p. 727, vol. 2.

Communication dated Feb. 23, 2015, issued by the Korean Intellectual Property Office in counterpart Korean application No. 10-2013-7028817.

\* cited by examiner

METHOD FOR PRODUCING MOLDS

TECHNICAL FIELD

The present invention is related to a method for producing molds having fine patterns of protrusions and recesses on the surfaces thereof.

BACKGROUND ART

There are high expectations regarding utilization of pattern transfer techniques that employ a nanoimprinting method to transfer patterns onto curable resin coated on objects to be processed, in applications to produce magnetic recording media such as DTM (Discrete Track Media) and BPM (Bit Patterned Media) and semiconductor devices.

The nanoimprinting method is a development of the well known embossing technique employed to produce optical discs. In the nanoimprinting method, a mold (commonly referred to as a mold, a stamper, or a template), on which a pattern of protrusions and recesses is formed, is pressed against curable resin coated on a substrate, which is an object to be processed. Pressing of the original onto the curable resin causes the curable resin to mechanically deform or to flow, to precisely transfer the fine pattern. If a mold is produced once, nano level fine structures can be repeatedly molded in a simple manner. Therefore, the nanoimprinting method is an economical transfer technique that produces very little harmful waste and discharge. Therefore, there are high expectations with regard to application of the nanoimprinting method in various fields.

Accompanying refinements in patterns of protrusions and recesses, it is an important objective to improve the release properties between molds and curable resin, from the viewpoint of pattern formation properties (the ease with which patterns of protrusions and recesses can be formed according to the designs thereof in the curable resin).

Methods in which mold release layers are formed to reduce the adhesive force between molds and curable resin to improve the release properties are being utilized. Methods for forming the mold release layers can be broadly divided into wet processes and dry processes.

Methods that employ the wet process immerse molds into solutions in which mold release agents such as silane coupling agents are dissolved, and cause the mold release agents to chemically react with the surfaces of the molds. Methods that employ the wet process require sufficient immersion time and a rinsing step after the immersion step. Therefore, such methods require several ten minutes to several hours as a whole, and there is a problem that throughput in mold production deteriorates.

Meanwhile, methods that employ the dry process form deposited films onto patterns of protrusions and recesses on molds by deposition methods such as the CVD (Chemical Vapor Deposition) method. In methods that employ the dry process, a series of steps (etching of substrates, asking, etc.) can form the deposited film using the same apparatus, and therefore it is expected that methods that employ the dry process can improve throughput over methods that employ the wet process.

Examples of methods that employ the dry process are disclosed in U.S. Patent Application Publication No. 20100055346 and M. Okada et al., "Nanoimprinting Using Plasma Chemical Vapor Deposition Film using Mixture Gas with $CHF_3$ and $O_2$ Gases Formed on Mold", Extended Abstract of the 56th JSAP Spring Meeting 2009, Vol. 2, p. 727, 2009, for example. U.S. Patent Application Publication No. 20100055346 discloses that a deposited fluorocarbon film is formed on a pattern of protrusions and recesses of a Ni mold. M. Okada et al., "Nanoimprinting Using Plasma Chemical Vapor Deposition Film using Mixture Gas with $CHF_3$ and $O_2$ Gases Formed on Mold", Extended Abstract of the 56th JSAP Spring Meeting 2009, Vol. 2, p. 727, 2009 discloses that a deposited fluorocarbon film is formed on a pattern of protrusions and recesses of a quartz mold by a reactive ion etching technique employing a CVD apparatus.

DISCLOSURE OF THE INVENTION

However, the methods disclosed in U.S. Patent Application Publication No. 20100055346 and M. Okada et al., "Nanoimprinting Using Plasma Chemical Vapor Deposition Film using Mixture Gas with $CHF_3$ and $O_2$ Gases Formed on Mold", Extended Abstract of the 56th JSAP Spring Meeting 2009, Vol. 2, p. 727, 2009 require separate steps for forming the sediment films as mold release layers, which is not sufficient from the viewpoint of improving throughput in production of molds.

The present invention has been developed in view of the foregoing circumstances. It is an object of the present invention to provide a method for manufacturing molds that enables improvement of throughput in production of molds having deposited films on the surfaces thereof as mold release layers.

A first method for producing a nanoimprinting mold of the present invention that achieves the above object is characterized by comprising:

forming a mask layer having a desired pattern on a quartz substrate;

plasma etching the quartz substrate employing an etching gas including a sedimentary gas and using the mask layer as a mask such that a pattern of protrusions and recesses having a desired shape constituted by the quartz substrate and the mask layer is formed and such that a deposited film constituted by sediment of the sedimentary gas is formed along the pattern of protrusions and recesses.

In the present specification, the "desired shape" of the pattern of protrusions and recesses refers to the shape designed as the shape of the pattern of protrusions and recesses on the mold excluding the deposited sediment.

In the first method for producing a nanoimprinting mold of the present invention, it is preferable for the quartz substrate to be etched while a temperature gradient is formed such that the temperature of portions at which it is easy for the sediment to be deposited is high and the temperature of portions at which it is difficult for the sediment to be deposited is low.

In the first method for producing a nanoimprinting mold of the present invention, it is preferable for the degree of the temperature gradient to be adjusted according to the progress of the etching of the quartz substrate.

In the first method for producing a nanoimprinting mold of the present invention, it is preferable for the temperature gradient to be formed in the in plane direction of the quartz substrate.

In the first method for producing a nanoimprinting mold of the present invention, it is preferable for the type and/or the percentage of the sedimentary gas in the etching gas to be adjusted according to the progress of the etching of the quartz substrate.

In the first method for producing a nanoimprinting mold of the present invention, it is preferable for the sedimentary gas to include at least one type of gas from among $C_xH_{2x+2-y}F_y$ (x=1 or 2, $1 \leq y \leq 2x+2$), $C_2H_{4-m}F_m$ ($1 \leq m \leq 4$), $C_pH_{2p+2-q}Cl_q$ (p=1 or 2, $1 \leq q \leq 2p+2$), $C_2H_{4-n}Cl_n$ ($1 \leq n \leq 4$), and $BCl_3$.

A second method for producing a nanoimprinting mold of the present invention is characterized by comprising:

forming a mask layer having a desired pattern on a quartz substrate;

etching the quartz substrate using the mask layer as a mask such that a pattern of protrusions and recesses having a desired shape is formed in the quartz substrate; and plasma ashing the mask layer using an ashing gas including a sedimentary gas such that the mask layer is removed and such that a deposited film constituted by sediment of the sedimentary gas is formed along the pattern of protrusions and recesses.

In the second method for producing a nanoimprinting mold of the present invention, it is preferable for the mask layer to be plasma asked while a temperature gradient is formed such that the temperature of portions at which it is easy for the sediment to be deposited is high and the temperature of portions at which it is difficult for the sediment to be deposited is low.

In the second method for producing a nanoimprinting mold of the present invention, it is preferable for the temperature gradient to be formed in the thickness direction of the quartz substrate.

In the second method for producing a nanoimprinting mold of the present invention, it is preferable for the temperature gradient to be formed in the in plane direction of the quartz substrate.

A third method for producing a nanoimprinting mold of the present invention is characterized by comprising:

forming a mask layer having a desired pattern on a quartz substrate;

plasma etching the quartz substrate employing an etching gas including a first sedimentary gas and using the mask layer as a mask such that a pattern of protrusions and recesses having a desired shape constituted by the quartz substrate and the mask layer is formed and such that a deposited film constituted by sediment of the sedimentary gas is formed along the pattern of protrusions and recesses; and plasma ashing the mask layer using an ashing gas including a second sedimentary gas such that the mask layer is removed and such that a deposited film constituted by sediment of the sedimentary gas is formed along the pattern of protrusions and recesses.

In the third method for producing a nanoimprinting mold of the present invention, it is preferable for the quartz substrate to be etched and/or the mask layer to be plasma ashed while a temperature gradient is formed such that the temperature of portions at which it is easy for the sediment to be deposited is high and the temperature of portions at which it is difficult for the sediment to be deposited is low.

In the third method for producing a nanoimprinting mold of the present invention, it is preferable for the temperature gradient to be formed in the thickness direction of the quartz substrate.

In the third method for producing a nanoimprinting mold of the present invention, it is preferable for the temperature gradient to be formed in the in plane direction of the quartz substrate.

According to the first method for producing a mold of the present invention, plasma etching is performed employing the etching gas that includes the sedimentary gas such that a pattern of protrusions and recesses having a desired shape constituted by the quartz substrate and the mask layer is formed and such that a deposited film constituted by sediment of the sedimentary gas is formed along the pattern of protrusions and recesses. Therefore, formation of the pattern of protrusions and recesses in the main body of the mold and formation of the deposited film can be performed simultaneously. Thereby, it becomes unnecessary to perform separate steps for forming a deposited film as a mold release layer. As a result, the throughput in production of molds having deposited films as mold release layers can be improved.

According to the second method for producing a mold of the present invention, the quartz substrate is etched such that a pattern of protrusions and recesses having a desired shape is formed, and the mask layer is plasma ashed employing an ashing gas that includes sedimentary gas such that the mask layer is removed and a deposited film constituted by sediment of the sedimentary gas is formed along the pattern of protrusions and recesses. Therefore, formation of the pattern of protrusions and recesses in the main body of the mold and formation of the deposited film can be performed simultaneously. Thereby, it becomes unnecessary to perform separate steps for forming a deposited film as a mold release layer. As a result, the throughput in production of molds having deposited films as mold release layers can be improved.

According to the third method for producing a mold of the present invention, plasma etching is performed employing the etching gas that includes the first sedimentary gas such that a pattern of protrusions and recesses having a desired shape is formed on the quartz substrate and such that a deposited film constituted by sediment of the sedimentary gas is formed along the pattern of protrusions and recesses. Then, the mask layer is plasma ashed employing an ashing gas that includes the second sedimentary gas such that the mask layer is removed and a deposited film constituted by sediment of the first and second sedimentary gases is formed along the pattern of protrusions and recesses. Therefore, ft/nation of the pattern of protrusions and recesses in the main body of the mold and formation of the deposited film can be performed simultaneously. Thereby, it becomes unnecessary to perform separate steps for forming a deposited film as a mold release layer. As a result, the throughput in production of molds having deposited films as mold release layers can be improved.

BEST MODE FOR CARRYING OUT THE INVENTION

Figure 1:
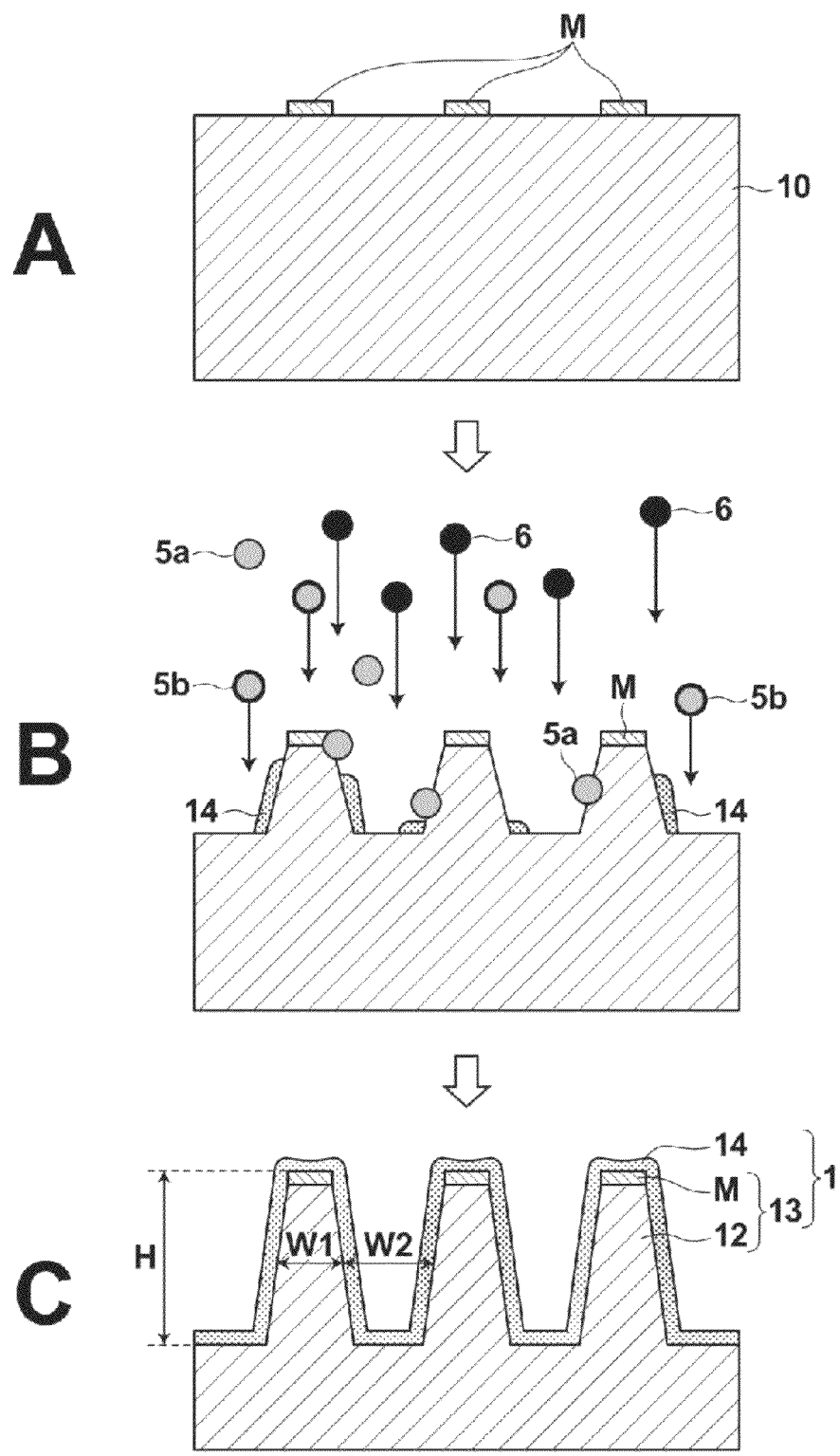
FIG. 1 is a collection of sectional diagrams that schematically illustrate etching steps of a method for producing a mold according to a first embodiment of the present invention.

Hereinafter, embodiments of the present invention will be described with reference to the attached drawings. However, the present invention is not limited to the embodiments to be described below. Note that in the drawings, the dimensions of the constitutive elements are drawn differently from the actual dimensions thereof, in order to facilitate visual recognition thereof.

First Embodiment of the Method for Producing a Mold

First, a method for producing a mold according to a first embodiment of the present invention will be described. FIG.

1 is a collection of sectional diagrams that schematically illustrate etching steps of a method for producing a mold according to the first embodiment of the present invention.

The method for producing a mold 1 of the present embodiment forms a mask layer M having a desired pattern on a quartz substrate 10 (A of FIG. 1), then plasma etches the quartz substrate employing an etching gas that includes a sedimentary gas 5a/5b and using the mask layer M as a mask, such that a pattern of protrusions and recesses having a desired shape constituted by the quartz substrate 10 and the mask layer M is formed and such that a deposited film constituted by sediment of the sedimentary gas is formed along the pattern of protrusions and recesses (B of FIG. 1).

The mold 1 produced by the method for producing a mold of the present embodiment is a mold 1 equipped with a mold main body 13 having a fine pattern of protrusions and recesses on the surface thereof, and a mold release layer 14 formed on the mold main body 13 along the pattern of protrusions and recesses (C of FIG. 1). The mold release layer 14 is constituted by a deposited film generated by the etching step utilizing the sedimentary gas.

The size of the quartz substrate is not particularly limited. It is preferable for the thickness of the quartz substrate 10 to be within a range from 0.3 mm to 7 mm, from the viewpoint of handling properties.

The material of the mask layer M is not particularly limited. Preferred examples of the material of the mask layer M are: metals, such as chrome, tungsten, tantalum, titanium, nickel, silver, platinum, and gold; oxides of these metals; and nitrides of these metals. Further, it is preferable for the mask layer M to have at least one layer that contains a chrome oxide or a chrome nitride. It is preferable for the thickness of the mask layer M to be within a range from 1 nm to 30 nm, from the viewpoint of thin film formation properties and light transmissive properties during nanoimprinting. The mask layer has a desired pattern corresponding to a pattern of protrusions and recesses to be formed in the mold 1 to be produced.

The mold main body 13 is a portion that defines the pattern of protrusions and recesses of the mold 1. That is, the pattern of protrusions and recesses is formed in the mold main body 13 according to the designed values of the pattern of protrusions and recesses of the mold 1. In the present embodiment, the mold main body 13 is constituted by the quartz substrate 10 and the mask layer M. Mask layers are generally removed, but in the present invention, the mold 1 also includes the mask layer M.

The shape of the pattern of protrusions and recesses of the mold main body 13 is not particularly limited, and may be selected as appropriate according to the intended use of the nanoimprinting mold. An example of a typical pattern is a line and space pattern as illustrated in C of FIG. 1. The length of the protrusions, the width W1 of the protrusions, the distance W2 among the protrusions (the width of the recesses), and the height H of the lines from the bottoms of the recesses (the depth of the recesses) are set as appropriate in the line and space pattern. For example, the width W1 of the lines is within a range from 10 nm to 100 nm, more preferably within a range from 20 nm to 70 nm, the distance W2 among the lines is within a range from 10 nm to 500 nm, more preferably within a range from 20 nm to 100 nm, and the height H of the lines is within a range from 10 nm to 500 nm, more preferably within a range from 30 nm to 100 nm. In addition, it is preferable for the aspect ratio H/W2 between the width W2 of the recesses and the depth H of the recesses to be within a range from 0.5 to 10. Note that in the present specification, the width W1 of the protrusions and the distance W2 among the protrusions refer to full widths at half maximum. In addition, the shapes of the protrusions that constitute the pattern of protrusions and recesses may be dots having rectangular, circular, or elliptical cross sections.

Etching of the quartz substrate 10 is executed employing an etching gas that includes sedimentary gas using the mask layer M as a mask, such that a pattern of protrusions and recesses having a desired shape constituted by the quartz substrate 10 and the mask layer M (that is, the mold main body 13) is formed and such that a deposited film constituted by sediment of the sedimentary gas is formed along the pattern of protrusions and recesses.

The sedimentary gas is that which is capable of etching the quartz substrate and generating sediment in the etching step. It is preferable for the sedimentary gas to include at least one type of gas from among $C_xH_{2x+2-y}F_y$ (x=1 or 2, $1 \le y \le 2x+2$), $C_2H_{4-m}F_m$ ($1 \le m \le 4$) $C_pH_{2p+2-q}Cl_q$ (p=1 or 2, $1 \le q \le 2p+2$), $C_2H_{4-n}Cl_n$ ($1 \le n \le 4$), and $BCl_3$. Radicals of the sedimentary gas are generated by performing etching using the sedimentary gas. The radicals contribute to reactions that form solid species, such as polymerization, to generate sediment that includes at least one type of compound from among fluorocarbon polymers, chlorocarbon polymers, boron compounds, and chlorine compounds. A deposited film is formed as the mold release layer 14 on the pattern of protrusions and recesses by the sediment being deposited on the pattern of protrusions and recesses.

The deposited film that functions as the mold release layer 14 is formed thinly along the pattern of protrusions and recesses of the mold main body 13. It is preferable for the thickness of the deposited film to be within a range from 0.5 nm to 3 nm.

The etching gas may include other gases having high etching performance, such as $SF_6$ and $Cl_2$, in addition to the sedimentary gas. In this case, each respective gas may be assigned the function of etching the quartz substrate and generating the sediment, and adjustments to etching conditions are facilitated. In addition, the etching gas may be diluted by a noble gas (argon gas, helium gas, etc.), oxygen gas, etc.

B of FIG. 1 illustrates the manner in which the sedimentary gas generates sediment while etching the quartz substrate 10. In B of FIG. 1, reference numeral 5a denotes radicals ($CF_2$, CF, etc., for example) derived from the sedimentary gas, reference numeral 5b denotes ions ($CHF_3^+$, $CF_2^+$, etc., for example) derived from the sedimentary gas, and reference numeral 6 denotes noble gas ions. As illustrated in B of FIG. 1, the present invention etches the quartz substrate 10 under conditions such that formation of the pattern of protrusions and recesses of the mold main body and formation of the deposited film as a mold release layer occur simultaneously. It is preferable for the quartz substrate 10 to be etched by the RIE method in order to realize these conditions. In this case, the percentage of the sedimentary gas within the etching gas, the flow rate of the etching gas, the plasma power, the bias power, the pressure, etc. are adjusted in order to realize such conditions. It is preferable for the RIE method to be that which has high vertical anisotropy (the degree at which movement of ions is biased in the depth direction of the recesses) in order to suppress under cutting (side etching) and also to enable the sedimentary gas to reach the depths of the recesses of the pattern of protrusions and recesses. It is particularly preferable for the RIE method to be ICP (Inductive Coupled Plasma) RIE, CCP (Capacitive Coupled Plasma) RIE, or ECR (Electron Cyclotron Resonance) RIE.

In the case that an isotropic etching method is utilized, the amount of generated sediment differs at the upper portions of the protrusions and at the bottoms of the recesses of the pattern of protrusions and recesses. As a result, there is a possibility that the deposited film to function as a mold release layer 14 will not be formed at the bottoms of the recesses. If there are many portions at which the deposited film is not formed, the mold release properties during nanoimprinting will not be sufficiently improved. In contrast, in the case that an etching method having high vertical anisotropy is utilized, it becomes possible to form the deposited film at the bottoms of the recesses as well, thereby improving the mold release properties.

Further, it is preferable for the present invention to adopt a configuration in which bias power (power to form a bias between plasma and a lower electrode) and plasma power (power to form plasma) are independently controllable, in order to facilitate control of the bias power.

It is preferable for etching of the quartz substrate 10 to be performed with the temperature of the substrate being within a range from $-100°$ C. to $300°$ C., more preferably within a range from $-50°$ C. to $200°$ C., and most preferably within a range from $-20°$ C. to $150°$ C. The present invention utilizes a phenomenon that deposition of sediment and etching of the sediment occur in a competitive manner. If the temperature of the substrate is lower than $-100°$ C., deposition of the radicals of the sedimentary gas, which is the material of the deposited film, will become excessive, and etching of the sediment will not occur. Conversely, if the temperature of the substrate is higher than $300°$ C., polymerized radicals of the sedimentary gas will be dissolved or disassociated by heat, and deposition of the sediment will not occur.

It is preferable for etching of the quartz substrate 10 to be performed while forming a temperature gradient in the quartz substrate 10 such that the temperatures of portions at which it is easy for the sediment to be deposited are high, and the temperatures of portions at which it is difficult for the sediment to be deposited are low. This is because the sediment has characteristics that it is difficult to be deposited at high temperature portions and easy to be deposited at low temperature portions. The portions at which it is easy for the sediment to be deposited and the portions at which it is difficult for the sediment to be deposited depend on the shape of the pattern of protrusions and recesses of the mold main body 13 and the spatial density distribution of plasma during RIE. For example, it is difficult for the sedimentary gas to reach the depths of the recesses of the pattern of protrusions and recesses, and therefore it is difficult for the sediment to be deposited. Meanwhile, the amount of the radicals of the sedimentary gas is low in regions where the spatial density of plasma is low, and therefore it is difficult for the sediment to be deposited in such regions.

Therefore, it is preferable for the temperature gradient to be formed in the thickness direction of the quartz substrate 10, taking the fact that it is difficult for the sediment to be deposited in the recesses of the pattern of protrusions and recesses into consideration. The temperature gradient in the thickness direction of the quartz substrate may be $dT/dz$ assuming that the upper direction illustrated in FIG. 1 is designated as a positive direction along a z axis. In this case, it is preferable for $dT/dz$ to be greater than $0°$ C./$\mu$m, more preferably greater than $30°$ C./$\mu$m, and most preferably greater than $100°$ C./$\mu$m. The temperature gradient may depend on z. The temperature gradient in the thickness direction of the quartz substrate may be formed from the surface of the quartz substrate on which the pattern of protrusions and recesses is formed to a portion in the vicinity thereof. This is because it is sufficient for the deposited film to be formed on the pattern of protrusions and recesses. The portion in the vicinity of the surface refers to a portion up to 10 $\mu$m from the surface, for example.

In the case that the temperature gradient is formed in the thickness direction of the quartz substrate 10, it is preferable for the degree of the temperature gradient to be adjusted according to the progress in etching of the quartz substrate. In patterns of protrusions and recesses in which the aspect ratio is greater than 3, there are significant differences in the deposition speed and adsorption properties of sediment at the vicinity of the bottoms of the recesses of and the deposition speed and adsorption properties of sediment at vicinity of the openings of the pattern of protrusions and recesses. For this reason, degrees of deposition of sediment will differ between the vicinity of the bottoms and the vicinity of the openings as etching progresses and the recesses of the pattern of protrusions and recesses become deeper. Therefore, the differences in the degree of deposition of the sediment is corrected by adjusting the temperature of the quartz substrate 10 according to the progression of etching thereof, that is, the depth of the pattern of protrusions and recesses. From a similar viewpoint, the type of sedimentary gas, the percentage of sedimentary gas within the etching gas, the flow rate of the etching gas, the plasma power, the bias power, the pressure, etc. may also be adjusted according to the progress of etching of the quartz substrate.

In addition, it is preferable for a temperature gradient to be formed in the in plane direction of the quartz substrate, taking the fact that it is difficult for sediment to be deposited at regions where the plasma density is relatively low. The temperature gradient in the in plane direction of the quartz substrate may be $dT/dr$ in a polar coordinate system having the center of the quartz substrate in the horizontal direction as an origin (in which the radial axis is r). This is because the plasma density is higher at the center of the chamber of an etching apparatus. In this case, it is preferable for $dT/dr$ to be less than $0°$ C./$\mu$m, more preferably less than $-1.0°$ C./$\mu$m, and most preferably less than $-1.5°$ C./$\mu$m. The temperature gradient may depend on r.

The temperature gradient may be controlled by cooling the lower portion or the edges of the quartz substrate 10. Liquids, such as water, organic solvents, $N_2$, $He_3$, and $He_4$, and gases, such as He gas, may be employed as the cooling medium. Alternatively, the top surface or the bottom surface of the quartz substrate 10 may be processed into a shape of protrusions and recesses that takes thermal conductive properties into consideration. As a further alternative, the quartz substrate 10 may be imparted with characteristic thermal conductive properties by causing the quartz substrate 10 to come into close contact with a different substrate. Further, a laminated thin film structure constituted by a single material or a plurality of materials may be formed on the bottom surface of the quartz substrate, to impart characteristic thermal conductive properties to the quartz substrate 10 in the direction perpendicular to the film. In this case, the laminated thin film structure may have a distribution in the in plan direction of the film surface, to impart characteristic thermal conductive properties to the quartz substrate 10 in the in plane direction.

The surface energy of the deposited film formed in the manner described above as the mold release layer 14 is approximately 25 mJ/mm$^2$ or less. This surface energy is advantageous from the viewpoint of mold release properties during nanoimprinting.

As described above, in the first method for producing a mold of the present embodiment, plasma etching is performed employing the etching gas that includes the sedimentary gas such that a pattern of protrusions and recesses having a desired shape constituted by the quartz substrate and the mask layer is formed and such that a deposited film constituted by sediment of the sedimentary gas is formed along the pattern of protrusions and recesses. Therefore, formation of the pattern of protrusions and recesses in the main body of the mold and formation of the deposited film can be performed simultaneously. Thereby, it becomes unnecessary to perform separate steps for forming a deposited film as a mold release layer. As a result, the throughput in production of molds having deposited films as mold release layers can be improved.

Second Embodiment of the Method for Producing a Mold

Figure 2:
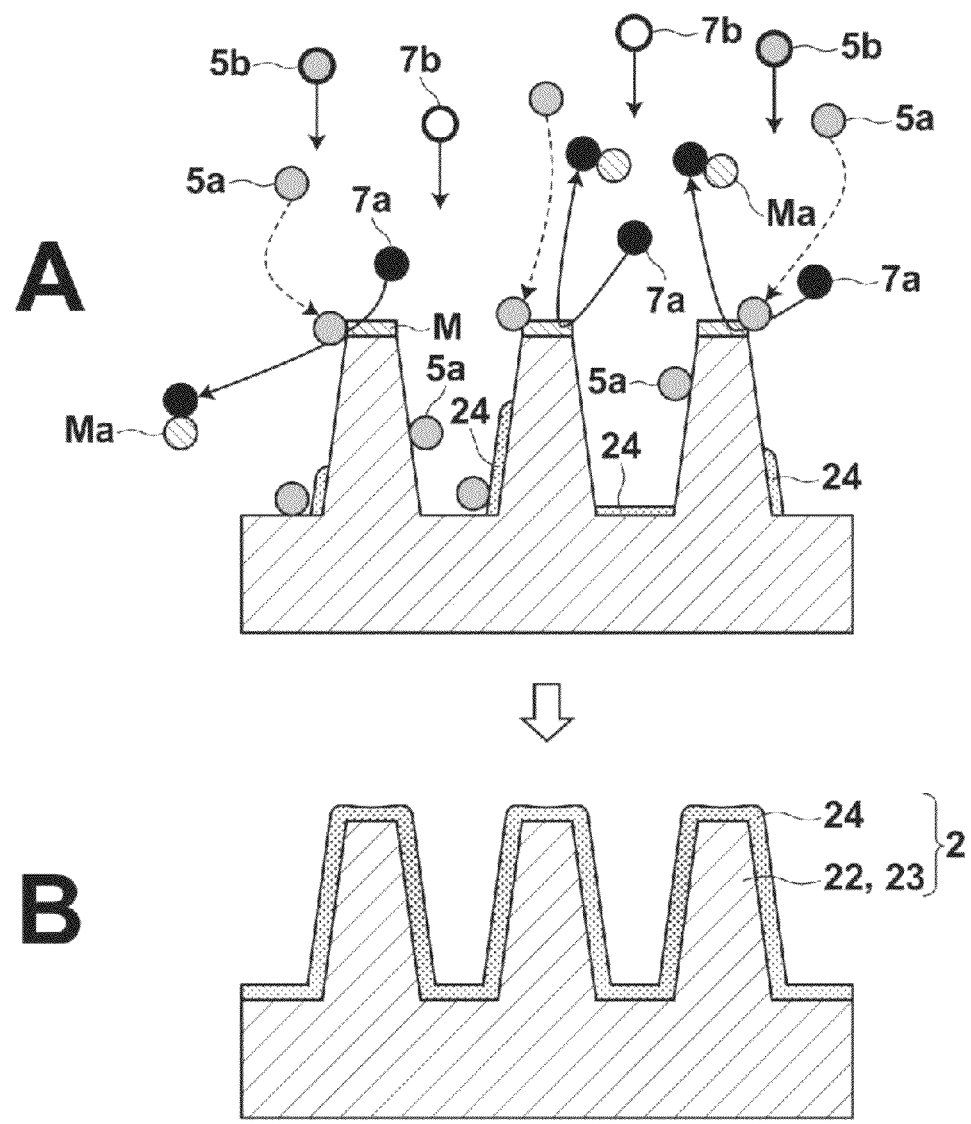
FIG. 2 is a collection of sectional diagrams that schematically illustrate ashing steps of a method for producing a mold according to a second embodiment of the present invention.
Figure 3:
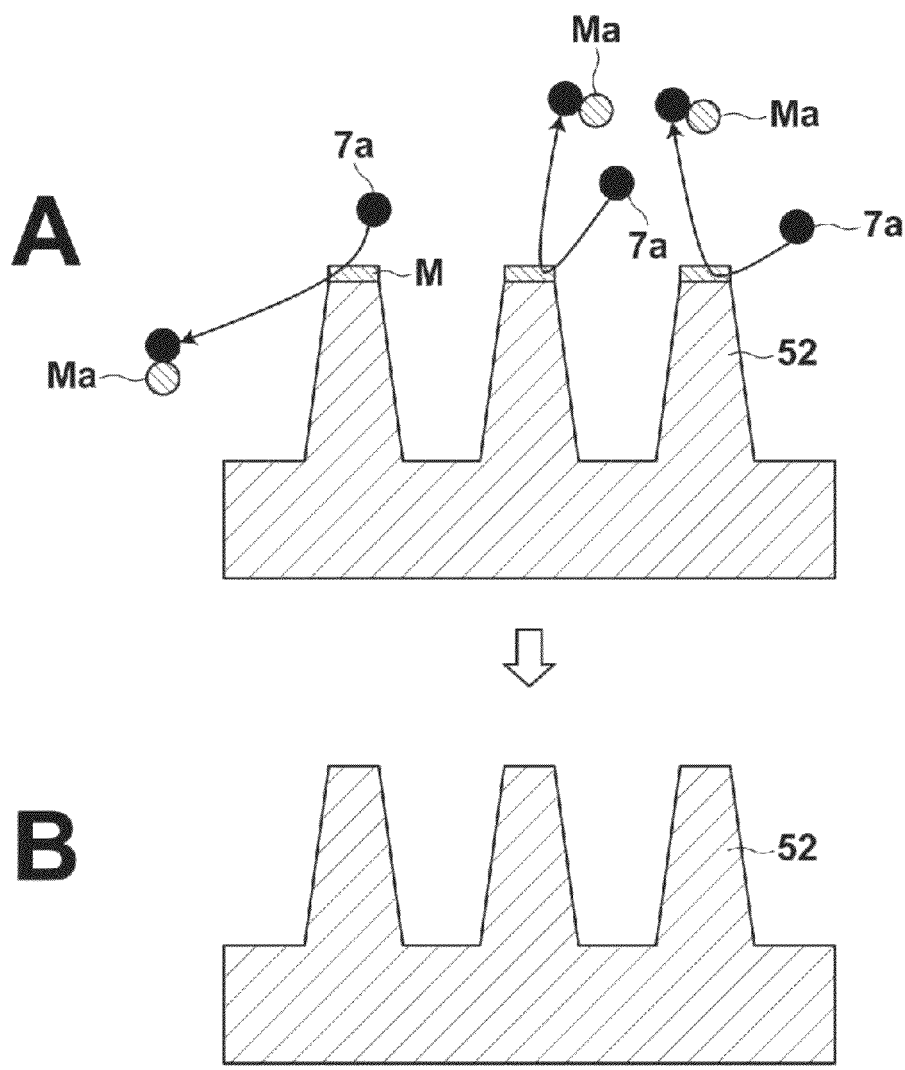
FIG. 3 is a collection of sectional diagrams that schematically illustrate ashing steps of a conventional method for producing a mold.

Next, a method for producing a mold according to a second embodiment of the present invention will be described. The method for producing a mold of the second embodiment differs from that of the first embodiment in that a deposited film is not formed during etching of a quartz substrate, but is formed when ashing a mask layer. Accordingly, detailed descriptions of constituent elements which are the same as those of the first embodiment will be omitted insofar as they are not particularly necessary. FIG. 2 is a collection of sectional diagrams that schematically illustrate ashing steps of a method for producing a mold according to the second embodiment of the present invention. FIG. 3 is a collection of sectional diagrams that schematically illustrate ashing steps of a conventional method for producing a mold.

In the method for producing a mold 2 of the second embodiment, a mask layer M having a desired pattern is formed on a quartz substrate 22. Then, the quartz substrate 22 is etched using the mask layer M as a mask such that a pattern of protrusions and recesses having a desired shape is formed on the quartz substrate 22. Then, a mixed ashing gas that includes a sedimentary gas 5a/5b and an ashing gas 7a/7b is employed to plasma ash the mask layer M such that the mask layer M is removed and a deposited film constituted by sediment of the sedimentary gas 5a/5b is formed along the pattern of protrusions and recesses (A of FIG. 2).

The mold 2 produced by the method for producing a mold of the present embodiment is a mold 2 equipped with a mold main body 23 having a fine pattern of protrusions and recesses on the surface thereof, and a mold release layer 24 formed on the mold main body 23 along the pattern of protrusions and recesses (B of FIG. 2). The mold release layer 24 is constituted by a deposited film generated by the ashing step utilizing the sedimentary gas.

In the present embodiment, the quartz substrate 22 itself, on which the pattern of protrusions and recesses is formed, becomes the mold main body 23.

The mold 2 may be produced in the same manner as conventional methods up to and including the step of etching the quartz substrate 22.

Ashing of the mask layer M is executed employing the mixed ashing gas that includes the sedimentary gas 5a/5b and the ashing gas 7a/7b to plasma ash the mask layer M such that the mask layer M is removed and a deposited film constituted by sediment of the sedimentary gas 5a/5b is formed along the pattern of protrusions and recesses.

The sedimentary gas is that which is capable of ashing the mask layer M and generating sediment in the ashing step. It is preferable for the sedimentary gas to include at least one type of gas from among $C_xH_{2x+2-y}F_y$ (x=1 or 2, 1≤y≤2x+2), $C_2H_{4-m}F_m$ (1≤m≤4) $C_pH_{2p+2-q}Cl_q$ (p=1 or 2, 1≤q≤2p+2) $C_2H_{4-n}Cl_n$ (1≤n≤4), and $BCl_3$. Radicals of the sedimentary gas are generated by performing ashing using the sedimentary gas.

The ashing gas may include other gases having high etching performance, such as $SF_6$ and $Cl_2$, in addition to the sedimentary gas. In addition, the ashing gas may be diluted by a noble gas (argon gas, helium gas, etc.), oxygen gas, etc.

A of FIG. 2 illustrates the manner in which the sedimentary gas generates sediment while ashing the mask layer M. In A of FIG. 2, reference numeral 5a denotes radicals ($CF_2$, CF, etc., for example) derived from the sedimentary gas, reference numeral 5b denotes ions ($CHF_3^+$, $CF_3^+$, etc., for example) derived from the sedimentary gas, reference numeral 7a denotes radicals derived from non sedimentary gas (oxygen radicals, chlorine radicals, etc., for example), and reference numeral 7b denotes ions derived from the non sedimentary gas (oxygen ions, chlorine ions, etc., for example). A of FIG. 2 illustrates the manner in which the radicals 5a derived from the sedimentary gas become attached and are deposited on the pattern of protrusions and recesses, and the manner in which the radicals 7a derived from the non sedimentary gas remove portions Ma of the mask layer M.

As illustrated in A of FIG. 2, the present invention ashes the mask layer M under conditions such that removal of the mask layer M and formation of the deposited film as the mold release layer 24 occur simultaneously. It is preferable for the mask layer M to be ashed by the RIE method in order to realize these conditions. In this case, the percentage of the sedimentary gas within the ashing gas, the flow rate of the ashing gas, the plasma power, the bias power, the pressure, etc. are adjusted in order to realize such conditions. It is preferable for the RIE method to be that which has high vertical anisotropy in order to enable the sedimentary gas to reach the depths of the recesses of the pattern of protrusions and recesses. It is particularly preferable for the RIE method to be ICP RIE, CCP RIE, or ECR RIE.

It is preferable for ashing of the mask layer to be performed with the temperature of the quartz substrate 22 being within a range from −100° C. to 300° C., more preferably within a range from −50° C. to 200° C., and most preferably within a range from −20° C. to 150° C.

It is preferable for ashing of the mask layer M to be performed while forming a temperature gradient in the quartz substrate 22 such that the temperatures of portions at which it is easy for the sediment to be deposited are high, and the temperatures of portions at which it is difficult for the sediment to be deposited are low.

In the present embodiment, the type of sedimentary gas may be changed during ashing of the mask layer M. For example, vertically anisotropic etching may be executed in an initial stage to form the deposited film at the bottoms of the recesses of the pattern of protrusions and recesses, and then isotropic etching may be executed in a next step to form the deposited film at the vicinities of the upper portions of the protrusions of the pattern of protrusions and recesses. The flow properties of resist during nanoimprinting may be taken into consideration and the deposited film may be formed such that the surface energy thereof decreases at locations closer to the bottoms of the recesses. In this case, the deposited film having different surface energies at different locations is advantageous from the viewpoint of mold release properties.

In a conventional method such as that illustrated in FIG. 3, an ashing step is that which merely removes a mask layer M from a substrate 52. However, in the second embodiment, removal of the mask layer M (that is, formation of the pattern of protrusions and recesses in the mold main body 23) and formation of the deposited film as the mold release layer 24 can be performed simultaneously. Accordingly, the throughput in production of molds having deposited films as mold release layers can be improved, as in the first embodiment.

Third Embodiment of the Method for Producing a Mold

Figure 4:
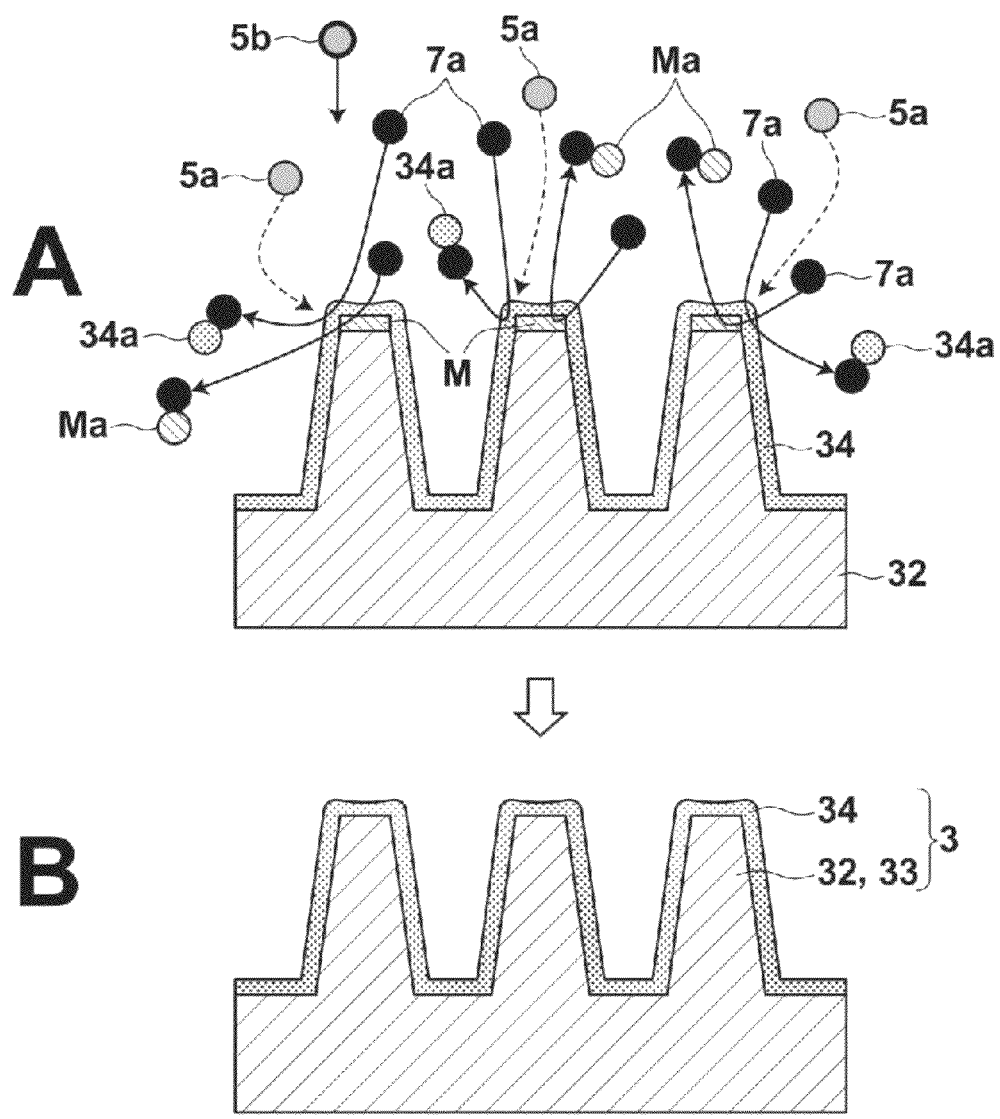
FIG. 4 is a collection of sectional diagrams that schematically illustrate ashing steps of a method for producing a mold according to a third embodiment of the present invention.

Next, a method for producing a mold according to a third embodiment of the present invention will be described. The method for producing a mold of the third embodiment differs from those of the first embodiment and the second embodiment in that a deposited film is formed both during etching of a quartz substrate and during ashing of a mask layer. Accordingly, detailed descriptions of constituent elements which are the same as those of the first embodiment and the second embodiment will be omitted insofar as they are not particularly necessary. FIG. 4 is a collection of sectional diagrams that schematically illustrate ashing steps of a method for producing a mold according to the third embodiment of the present invention.

In the method for producing a mold 3 of the third embodiment, a mask layer M having a desired pattern is formed on a quartz substrate 32. Then, the quartz substrate 32 is plasma etched using the mask layer M as a mask and employing an etching gas that includes a first sedimentary gas such that a pattern of protrusions and recesses having a desired shape is formed on the quartz substrate 32 and sediment of the sedimentary gas is deposited along the pattern of protrusions and recesses. Then, a mixed ashing gas that includes a second sedimentary gas 5a/5b and an ashing gas 7a/7b is employed to plasma ash the mask layer M such that the mask layer M is removed and a deposited film constituted by sediment of the first and second sedimentary gases is formed along the pattern of protrusions and recesses (A of FIG. 4).

The mold 3 produced by the method for producing a mold of the present embodiment is a mold 3 equipped with a mold main body 33 having a fine pattern of protrusions and recesses on the surface thereof, and a mold release layer 34 formed on the mold main body 33 along the pattern of protrusions and recesses (B of FIG. 4). The mold release layer 34 is constituted by a deposited film generated by the etching step and the ashing step utilizing the sedimentary gases.

In the present embodiment, the quartz substrate 32 itself, on which the pattern of protrusions and recesses is formed, becomes the mold main body 33.

Etching of the quartz substrate 32 is basically executed in the same manner as that of the first embodiment. However, because sediment is deposited in the ashing step to be executed later, it is not necessary for the complete deposited film to be formed as the mold release layer 34 when etching of the quartz substrate 32 is complete.

Ashing of the mask layer M is executed in the same manner as that of the second embodiment.

A of FIG. 4 illustrates the manner in which the sedimentary gas ashes the mask layer, and the sediment is removed and deposited. In A of FIG. 4, reference numeral 5a denotes radicals ($CF_2$, CF, etc., for example) derived from the sedimentary gas, reference numeral 5b denotes ions ($CHF_3^+$, $CF_2^+$, etc., for example) derived from the sedimentary gas, and reference numeral 7a denotes radicals derived from non sedimentary gas (oxygen radicals, chlorine radicals, etc., for example). A of FIG. 4 illustrates the manner in which portions 34a of the deposited film are removed by the radicals 7a derived from the non sedimentary gas, while the radicals 5a derived from the sedimentary gas become attached and are deposited on the pattern of protrusions and recesses, and the radicals 7a derived from the non sedimentary gas remove portions Ma of the mask layer M.

According to the method for producing a mold of the third embodiment, the etching gas that includes the first sedimentary gas is employed to etch the quartz substrate such that a pattern of protrusions and recesses having a desired shape is formed on the quartz substrate and such that a deposited film constituted by sediment of the sedimentary gas is formed along the pattern of protrusions and recesses. Then, the mask layer is ashed employing a mixed ashing gas that includes the second sedimentary gas such that the mask layer is removed and a deposited film constituted by sediment of the first and second sedimentary gases is formed along the pattern of protrusions and recesses. Therefore, formation of the pattern of protrusions and recesses in the main body of the mold and formation of the deposited film can be performed simultaneously. Accordingly, the third embodiment exhibits the same advantageous effects as those of the first embodiment and the second embodiment.

Further, according to the method for producing a mold of the third embodiment, two steps for depositing the sediment are executed. Therefore, conditions during the step of etching the quartz substrate 32 and the step of ashing the mask layer M can be set more flexibly.

Further, according to the method for producing a mold of the third embodiment, the mask layer on the protrusions of the pattern of protrusions and recesses can be removed while suppressing damage to the deposited film even in cases that the deposited film is already formed as the mold release layer during the step of ashing the mask layer. This is because portions 34a of the deposited film which are removed by the radicals 7a derived from the non sedimentary gas are complemented by the radicals 5a derived from the sedimentary gas.

EXAMPLES

Examples of the method for producing a mold of the present invention will be described below.

Example 1-1

Production of the Mold (Substrate Processing)

The surface of a 6 inch diameter quartz substrate having a 10 nm chrome layer on the surface thereof was processed by KBM-5103 (by Shin-Etsu Chemical K. K.), which is a silane coupling agent having superior close contact properties with respect to photocurable resist. The KBM-5103 was diluted to 1% by mass with PGMEA, and coated on the surface of the substrate by the spin coat method. Thereafter, the coated substrate was annealed at 120° C. for 20 minutes on a hot plate, to cause the silane coupling agent to bond to the surface of the substrate.

(Imprinting Step)

Next, a photocurable resist was coated on the 6 inch diameter quartz substrate which has undergone the close contact process, to coat the quartz substrate with a 60 nm thick resist film. Then, a Si mold having a pattern of protrusions and recesses in which the widths of the protrusions are 30 nm, the heights of the protrusions are 40 nm, the periodic intervals among the protrusions are 60 nm, and the area of the pattern as a whole is 10 μm·60 μm was pressed against the resist film. Thereafter, the resist film was cured by irradiating ultraviolet light thereon, and the pattern of protrusions and recesses of the Si mold was transferred to the resist film.

(Mold Release Step)

The outer edge portions of the substrate and the mold were mechanically held or the rear surfaces of the substrate and the mold were held by suction. In this state, the substrate or the mold was relatively moved in a direction opposite the pressing direction, to release and separate the Si mold and to obtain the resist film on which the pattern of protrusions and recesses was transferred.
(Resist)

A resist formed by mixing the compound represented by Chemical Formula 1 below, IRGACURE 379, and a fluorine monomer represented by Chemical Formula 2 below at a ratio of 97:2:1 by mass was utilized as the photocurable resist.

[Chemical Formula 1]

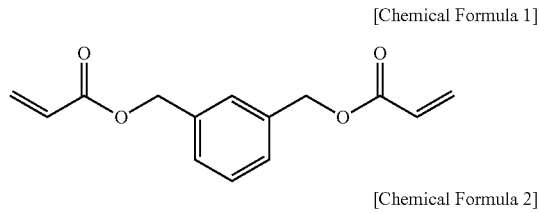

[Chemical Formula 2]

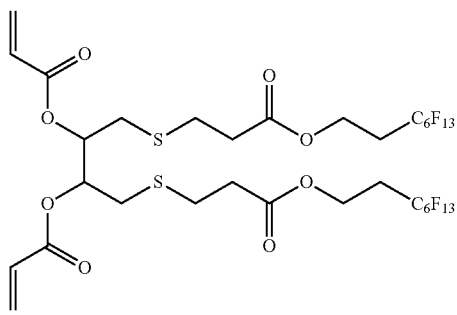

(Etching)

The chrome layer was patterned by dry etching using the resist film having the pattern of protrusions and recesses transferred thereon as a mask. Next, the quartz substrate was etched using the patterned chrome layer as a mask, to transfer the shapes of protrusions and recesses onto the quartz substrate, to obtain a first quartz mold. Etching of the quartz substrate was performed by an ICP (Inductive Coupled Plasma) reactive ion etching apparatus employing a mixed gas that included fluorocarbon, which is a sedimentary gas, as an etching gas with bias applied to a depth of 60 nm. The protrusions of the pattern of protrusions and recesses of the first quartz mold have an aspect ratio of 2 (height 60 nm/width 30 nm).
<Evaluation of Mold Release Properties>
(Substrate Processing)

The surface of an 8 inch diameter silicon substrate was processed by KBM-5103 (by Shin-Etsu Chemical K. K.), which is a silane coupling agent having superior close contact properties with respect to photocurable resist.
(Imprinting)

Next, a photocurable resist was coated on the 8 inch diameter silicon substrate, to coat the silicon substrate with a 60 nm thick resist film. Then, the first quartz mold was pressed against the resist film. Thereafter, the resist film was cured by irradiating ultraviolet light thereon, and the pattern of protrusions and recesses of the first quartz mold was transferred to the resist film.
(Mold Release Step)

The outer edge portions of the 8 inch diameter silicon substrate were mechanically held or the rear surface thereof was held by suction. In this state, the substrate or the mold was relatively moved in a direction opposite the pressing direction, to release and separate the mold and to obtain the resist film on which the pattern of protrusions and recesses was transferred.
(Resist)

The same photocurable resist as that which was employed in the mold production steps described above was employed.
(Evaluation of Mold Release Defects)

An SEM (Scanning Electron Microscope) by Nippon Electron K. K. capable of measuring lengths was used to evaluate whether defects (peeling of resist) had occurred in the resist film, on to which the pattern of protrusions and recesses had been transferred.

Example 1-2

A first quartz mold was produced in the same manner as that for Example 1-1, except that the aspect ratio of the pattern of protrusions and recesses was set to 3 (height 90 nm/width 30 nm). Imprinting and evaluations were conducted in the same manner as that for Example 1-1.

Example 1-3

A first quartz mold was produced in the same manner as that for Example 1-1, except that the aspect ratio of the pattern of protrusions and recesses was set to 6 (height 180 nm/width 30 nm). Imprinting and evaluations were conducted in the same manner as that for Example 1-1.

Comparative Example 1-1

A first quartz mold was produced in the same manner as that for Example 1-1, except that an ashing step was performed to remove the mask after etching of the quartz substrate using the chrome layer as a mask, and a deposited film was formed as a mold release layer by CVD. Imprinting and evaluations were conducted in the same manner as that for Example 1-1.

Comparative Example 1-2

A first quartz mold was produced in the same manner as that for Example 1-1, except that a sedimentary gas was not employed during etching of the quartz substrate using the chrome layer as a mask. Imprinting and evaluations were conducted in the same manner as that for Example 1-1.

Comparative Example 1-3

A first quartz mold was produced in the same manner as that for Example 1-1, except that an ashing step was performed to remove the mask after etching of the quartz substrate using the chrome layer as a mask, and a deposited film was formed as a mold release layer by a wet process (immersing the quartz substrate in a mold release agent solution). Imprinting and evaluations were conducted in the same manner as that for Example 1-1. Here, a silane coupling agent represented by Chemical Formula 3 was employed as the mold release agent solution.

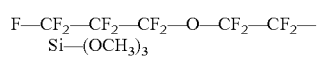

[Chemical Formula 3]

Comparative Example 1-4

A first quartz mold was produced in the same manner as that for Comparative Example 1-1, except that the aspect ratio of the pattern of protrusions and recesses was set to 3. Imprinting and evaluations were conducted in the same manner as that for Example 1-1.

Comparative Example 1-5

A first quartz mold was produced in the same manner as that for Comparative Example 1-2, except that the aspect ratio of the pattern of protrusions and recesses was set to 3. Imprinting and evaluations were conducted in the same manner as that for Example 1-1.

Comparative Example 1-6

A first quartz mold was produced in the same manner as that for Comparative Example 1-3, except that the aspect ratio of the pattern of protrusions and recesses was set to 3. Imprinting and evaluations were conducted in the same manner as that for Example 1-1.

Comparative Example 1-7

A first quartz mold was produced in the same manner as that for Comparative Example 1-1, except that the aspect ratio of the pattern of protrusions and recesses was set to 6. Imprinting and evaluations were conducted in the same manner as that for Example 1-1.

Comparative Example 1-8

A first quartz mold was produced in the same manner as that for Comparative Example 1-2, except that the aspect ratio of the pattern of protrusions and recesses was set to 6. Imprinting and evaluations were conducted in the same manner as that for Example 1-1.

Comparative Example 1-9

A first quartz mold was produced in the same manner as that for Comparative Example 1-3, except that the aspect ratio of the pattern of protrusions and recesses was set to 6. Imprinting and evaluations were conducted in the same manner as that for Example 1-1.

Example 2-1

A second quartz mold was produced in the same basic manner as that for Example 1-1, except that the etching step described below was substituted for the etching step of Example 1-1.
(Etching and Ashing)
A chrome layer was patterned by dry etching using a resist film having the pattern of protrusions and recesses transferred thereon as a mask. Next, a quartz substrate was etched using the patterned chrome layer as a mask, to transfer the shapes of protrusions and recesses onto the quartz substrate, to obtain a quartz mold. Etching of the quartz substrate was performed by an ICP (Inductive Coupled Plasma) reactive ion etching apparatus employing a mixed gas that included fluorocarbon, which is a sedimentary gas, as an etching gas with bias applied to a depth of 60 nm. Then, the same etching apparatus performed ashing to remove the mask, to obtain a second quartz mold. A mixed ashing gas that includes 40% of a sedimentary gas was employed to remove the mask. The protrusions of the pattern of protrusions and recesses of the second quartz mold have an aspect ratio of 2 (height 60 nm/width 30 nm). Imprinting and evaluations were conducted in the same manner as that for Example 1-1.

Example 2-2

A second quartz mold was produced in the same manner as that for Example 2-1, except that the aspect ratio of the pattern of protrusions and recesses was set to 3 (height 90 nm/width 30 nm). Imprinting and evaluations were conducted in the same manner as that for Example 1-1.

Example 2-3

A second quartz mold was produced in the same manner as that for Example 2-1, except that the aspect ratio of the pattern of protrusions and recesses was set to 6 (height 180 nm/width 30 nm). Imprinting and evaluations were conducted in the same manner as that for Example 1-1.

Comparative Example 2-1

A second quartz mold was produced in the same manner as that for Example 2-1, except that a conventional ashing step (employing an ashing gas that does not include sedimentary gas) was performed to remove the mask after etching of the quartz substrate using the chrome layer as a mask, and a deposited film was formed as a mold release layer by CVD. Imprinting and evaluations were conducted in the same manner as that for Example 1-1.

Comparative Example 2-2

A second quartz mold was produced in the same manner as that for Example 2-1, except that an ashing gas that does not include sedimentary gas was employed during an ashing step to remove the mask. Imprinting and evaluations were conducted in the same manner as that for Example 1-1.

Comparative Example 2-3

A second quartz mold was produced in the same manner as that for Example 2-1, except that a conventional ashing step (employing an ashing gas that does not include sedimentary gas) was performed to remove the mask after etching of the quartz substrate using the chrome layer as a mask, and a deposited film was formed as a mold release layer by a wet process (immersing the quartz substrate in a mold release agent solution). Imprinting and evaluations were conducted in the same manner as that for Example 1-1. Here, a silane coupling agent represented by Chemical Formula 3 above was employed as the mold release agent solution.

Comparative Example 2-4

A second quartz mold was produced in the same manner as that for Comparative Example 2-1, except that the aspect ratio of the pattern of protrusions and recesses was set to 3. Imprinting and evaluations were conducted in the same manner as that for Example 1-1.

Comparative Example 2-5

A second quartz mold was produced in the same manner as that for Comparative Example 2-2, except that the aspect ratio of the pattern of protrusions and recesses was set to 3. Imprinting and evaluations were conducted in the same manner as that for Example 1-1.

Comparative Example 2-6

A second quartz mold was produced in the same manner as that for Comparative Example 2-3, except that the aspect ratio of the pattern of protrusions and recesses was set to 3. Imprinting and evaluations were conducted in the same manner as that for Example 1-1.

Comparative Example 2-7

A second quartz mold was produced in the same manner as that for Comparative Example 2-1, except that the aspect ratio of the pattern of protrusions and recesses was set to 6. Imprinting and evaluations were conducted in the same manner as that for Example 1-1.

Comparative Example 2-8

A second quartz mold was produced in the same manner as that for Comparative Example 2-2, except that the aspect ratio of the pattern of protrusions and recesses was set to 6. Imprinting and evaluations were conducted in the same manner as that for Example 1-1.

Comparative Example 2-9

A second quartz mold was produced in the same manner as that for Comparative Example 2-3, except that the aspect ratio of the pattern of protrusions and recesses was set to 6. Imprinting and evaluations were conducted in the same manner as that for Example 1-1.

[Results]

The evaluation results are shown in Table 1 and Table 2. Table 1 shows the main execution conditions and results for Examples 1-1 through 1-3 and Comparative Examples 1-1 through 1-9. Table 2 shows the main execution conditions and results for Examples 2-1 through 2-3 and Comparative Examples 2-1 through 2-9.

Based on the evaluation results, it was confirmed that the present invention improves throughput in production of molds having deposited films on the surfaces thereof as mold release layers, and that the method for producing molds of the present invention can be applied to produce molds having higher aspect ratios then conventional methods. Contact areas between molds and photocurable resist become greater as the aspect ratio of the patterns on the molds becomes higher. Release defects become more likely to occur when the contact areas are great. However, it was confirmed that the method for producing molds according to the present invention can produce molds that exhibit favorable release properties even when patterns of protrusions and recesses have aspect ratios greater than 3, whereas release defects occur when molds produced by conventional methods have patterns with such aspect ratios.

TABLE 1

| | Aspect Ratio of Quartz Mold | Percentage of Sedimentary Gas during Etching | Ashing of Mask | Separate Mold Release Layer Forming Step | Release Defects Following Imprinting |
|---|---|---|---|---|---|
| Example 1-1 | 2 | 40 | No | n/a | No |
| Comparative Example 1-1 | 2 | 40 | Yes | CVD | No |
| Comparative Example 1-2 | 2 | 0 | No | n/a | Yes |
| Comparative Example 1-3 | 2 | 40 | Yes | Wet | No |
| Example 1-2 | 3 | 40 | No | n/a | No |
| Comparative Example 1-4 | 3 | 40 | Yes | CVD | Yes |
| Comparative Example 1-5 | 3 | 0 | No | n/a | Yes |
| Comparative Example 1-6 | 3 | 40 | Yes | Wet | Yes |
| Example 1-3 | 6 | 40 | No | n/a | No |
| Comparative Example 1-7 | 6 | 40 | Yes | CVD | Yes |
| Comparative Example 1-8 | 6 | 0 | No | n/a | Yes |
| Comparative Example 1-9 | 6 | 40 | Yes | Wet | Yes |

TABLE 2

| | Aspect Ratio of Quartz Mold | Sedimentary Gas Used During Ashing | Separate Mold Release Layer Forming Step | Release Defects Following Imprinting |
|---|---|---|---|---|
| Example 2-1 | 2 | Yes | n/a | No |
| Comparative Example 2-1 | 2 | No | CVD | No |
| Comparative Example 2-2 | 2 | No | n/a | Yes |
| Comparative Example 2-3 | 2 | No | Wet | No |
| Example 2-2 | 3 | Yes | n/a | No |
| Comparative Example 2-4 | 3 | No | CVD | Yes |
| Comparative Example 2-5 | 3 | No | n/a | Yes |
| Comparative Example 2-6 | 3 | No | Wet | Yes |
| Example 2-3 | 6 | Yes | n/a | No |
| Comparative Example 2-7 | 6 | No | CVD | Yes |
| Comparative Example 2-8 | 6 | No | n/a | Yes |
| Comparative Example 2-9 | 6 | No | Wet | Yes |

What is claimed is:

1. A method for producing a nanoimprinting mold having a mold release layer on the surface thereof, comprising:

forming a mask layer having a desired pattern on a quartz substrate;

plasma etching the quartz substrate employing an etching gas including a sedimentary gas and using the mask layer as a mask to form a pattern of protrusions and recesses having a desired shape constituted by the quartz substrate and the mask layer and a mold release layer which is a blanket deposited film constituted by sediment of the sedimentary gas, covering the pattern of protrusions and recesses along the pattern of protrusions and recesses, the plasma etching being performed under conditions that recesses are formed at exposure portions of the quartz substrate from the mask layer while forming the blanket deposited film on the recesses of the quartz substrate and the mask layer.

2. A method for producing a nanoimprinting mold as defined in claim 1, wherein:
the quartz substrate is etched while a temperature gradient is formed such that the temperature is lower at portions toward the bottoms of the recesses of the pattern of protrusions and recesses at regions at which the spatial density of plasma is lower.

3. A method for producing a nanoimprinting mold as defined in claim 2, wherein:
the temperature gradient is formed in the thickness direction of the quartz substrate.

4. A method for producing a nanoimprinting mold as defined in claim 3, wherein:
the degree of the temperature gradient is adjusted according to the progress of the etching of the quartz substrate.

5. A method for producing a nanoimprinting mold as defined in claim 2, wherein:
the temperature gradient is formed in the in plane direction of the quartz substrate.

6. A method for producing a nanoimprinting mold as defined in claim 1, wherein:
the type and/or the percentage of the sedimentary gas in the etching gas is adjusted according to the progress of the etching of the quartz substrate.

7. A method for producing a nanoimprinting mold as defined in claim 1, wherein:
the sedimentary gas includes at least one type of gas from among $C_xH_{2x+2-y}F_y$ ($x=1$ or $2$, $1 \leq y \leq 2x+2$), $C_2H_{4-m}F_m$ ($1 \leq m \leq 4$), $C_pH_{2p+2-q}Cl_q$ ($p=1$ or $2$, $1 \leq q \leq 2p+2$), $C_2H_{4-n}Cl_n$ ($1 \leq n \leq 4$), and $BCl_3$.

8. A method for producing a nanoimprinting mold, comprising:
forming a mask layer having a desired pattern on a quartz substrate;
etching the quartz substrate using the mask layer as a mask such that a pattern of protrusions and recesses having a desired shape is formed in the quartz substrate; and
plasma ashing the mask layer using an ashing gas including a sedimentary gas to form a mold release layer which is a blanket deposited film constituted by sediment of the sedimentary gas, covering the pattern of protrusions and recesses along the pattern of protrusions and recesses, plasma ashing being executed under conditions that the mask layer is removed while forming the blanket deposited film on the surface of the pattern of protrusions and recesses.

9. A method for producing a nanoimprinting mold as defined in claim 8, wherein:
the mask layer is plasma ashed while a temperature gradient is formed such that the temperature is lower at portions toward the bottoms of the recesses of the pattern of protrusions and recesses at regions at which the spatial density of plasma is lower.

10. A method for producing a nanoimprinting mold as defined in claim 9, wherein:
the temperature gradient is formed in the thickness direction of the quartz substrate.

11. A method for producing a nanoimprinting mold as defined in claim 9, wherein:
the temperature gradient is formed in the in plane direction of the quartz substrate.

12. A method for producing a nanoimprinting mold, comprising:
forming a mask layer having a desired pattern on a quartz substrate;
plasma etching the quartz substrate employing an etching gas including a first sedimentary gas and using the mask layer as a mask under conditions that recesses are formed at exposure portions of the quartz substrate from the mask layer while forming a deposited film constituted by first sediment of the sedimentary gas on the recesses of the quartz substrate and the mask layer, and such that a pattern of protrusions and recesses having a desired shape constituted by the quartz substrate and the mask layer which is covered with the deposited film formed along the pattern of protrusions and recesses is formed; and
plasma ashing the mask layer using an ashing gas including a second sedimentary gas under conditions that the mask layer is removed while forming a deposited film constituted by sediment of the first and second sedimentary gases on the surface of the pattern of protrusions and recesses, and such that the pattern of protrusions and recesses is covered with the deposited film formed along the pattern of protrusions and recesses, which functions as a mold release layer.

13. A method for producing a nanoimprinting mold as defined in claim 12, wherein:
the quartz substrate is etched and/or the mask layer is plasma ashed while a temperature gradient is formed such that the temperature is lower at portions toward the bottoms of the recesses of the pattern of protrusions and recesses at regions at which the spatial density of plasma is lower.

14. A method for producing a nanoimprinting mold as defined in claim 13, wherein:
the temperature gradient is formed in the thickness direction of the quartz substrate.

15. A method for producing a nanoimprinting mold as defined in claim 13, wherein:
the temperature gradient is formed in the in plane direction of the quartz substrate.

* * * * *